(12) United States Patent
Yamaji et al.

(10) Patent No.: US 8,531,254 B2
(45) Date of Patent: Sep. 10, 2013

(54) ELASTIC WAVE DEVICE

(75) Inventors: Toru Yamaji, Osaka (JP); Koji Kawakita, Nara (JP); Tetsuya Tsurunari, Osaka (JP); Joji Fujiwara, Osaka (JP); Toru Jibu, Hyogo (JP)

(73) Assignee: Panasonic Corporation, Osaka (JP)

( * ) Notice: Subject to any disclaimer, the term of this patent is extended or adjusted under 35 U.S.C. 154(b) by 315 days.

(21) Appl. No.: 13/040,450

(22) Filed: Mar. 4, 2011

(65) Prior Publication Data

US 2011/0221546 A1 Sep. 15, 2011

(30) Foreign Application Priority Data

Mar. 9, 2010 (JP) ................................ 2010-051665

(51) Int. Cl.
*H03H 9/10* (2006.01)
(52) U.S. Cl.
USPC .................... 333/193; 333/195; 310/313 R
(58) Field of Classification Search
USPC ............. 333/133, 150, 193–196; 310/313 R, 310/313 B, 340
See application file for complete search history.

(56) References Cited

U.S. PATENT DOCUMENTS

| | | | |
|---|---|---|---|
| 7,427,824 B2 | 9/2008 | Iwamoto et al. | |
| 7,913,367 B2* | 3/2011 | Tsuda | 29/25.35 |
| 2005/0199979 A1* | 9/2005 | Shimoishizaka et al. | 257/528 |
| 2007/0023862 A1* | 2/2007 | Takagi | 257/531 |
| 2007/0040238 A1* | 2/2007 | Yamasaki et al. | 257/531 |
| 2009/0309673 A1* | 12/2009 | Iwamoto | 333/133 |
| 2010/0225202 A1* | 9/2010 | Fukano et al. | 310/313 C |
| 2012/0280768 A1* | 11/2012 | Nakayama et al. | 333/193 |

FOREIGN PATENT DOCUMENTS

| | | | |
|---|---|---|---|
| JP | 2004-200776 | * | 7/2004 |
| JP | 2005-252335 | * | 9/2005 |
| JP | 2006-324894 | * | 11/2006 |
| JP | 2009-225118 | * | 10/2009 |
| JP | 2009-247014 | * | 10/2009 |
| WO | WO 2006/134928 A1 | | 12/2006 |

* cited by examiner

*Primary Examiner* — Barbara Summons
(74) *Attorney, Agent, or Firm* — RatnerPrestia

(57) ABSTRACT

An elastic wave device includes a piezoelectric substrate, an IDT electrode disposed on the piezoelectric substrate, an internal electrode disposed on the piezoelectric substrate and connected to the IDT electrode, a support pillar disposed on the piezoelectric substrate and provided around the IDT electrode, a top panel provided on the support pillar to cover a space above the IDT electrode, an insulation protector provided to cover the support pillar and the top panel, an external electrode disposed on the insulation protector, a conductor pattern disposed on the insulation protector in order to obtain inductance, and a connection electrode provided through the insulation protector, to connect the external electrode and the internal electrode to each other.

7 Claims, 12 Drawing Sheets

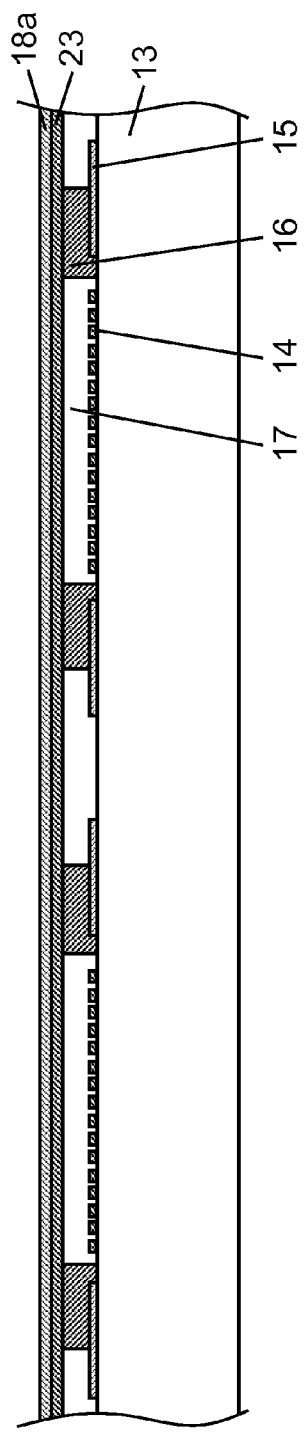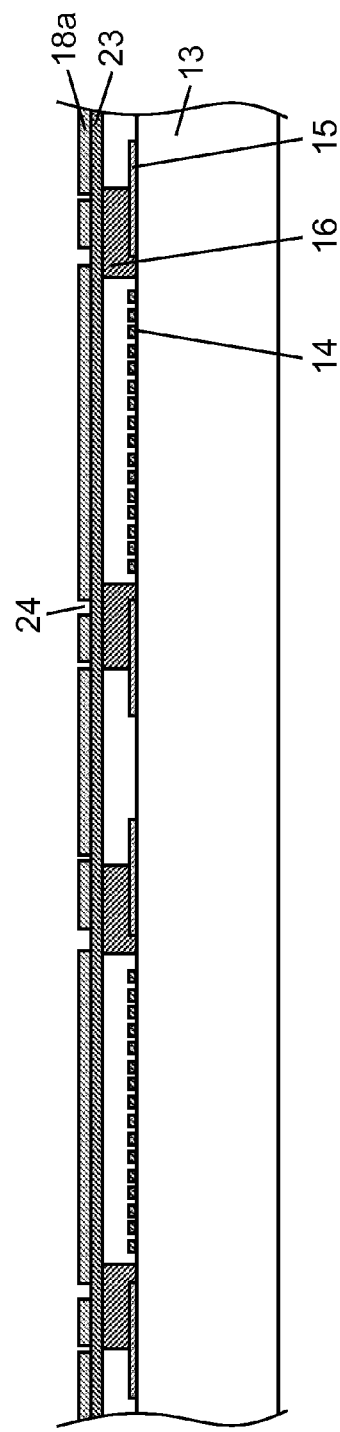
FIG. 4A
FIG. 4B

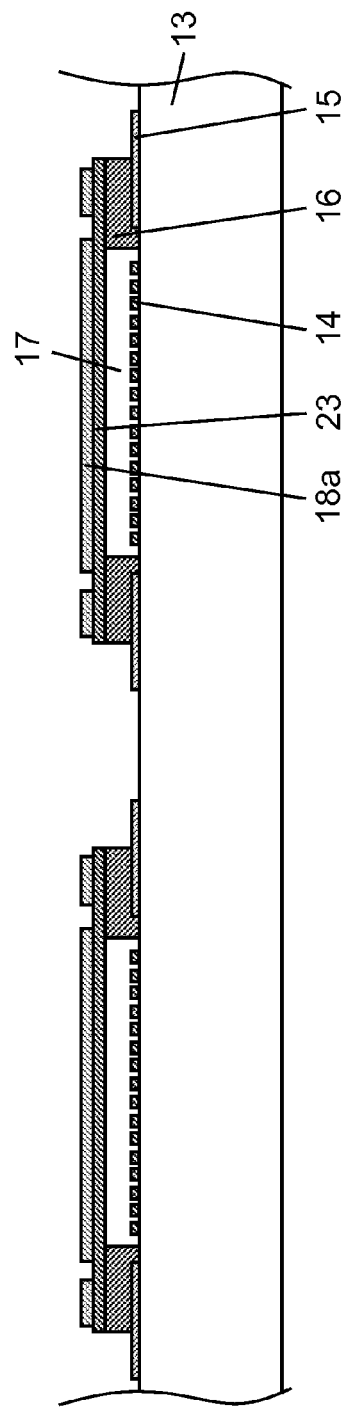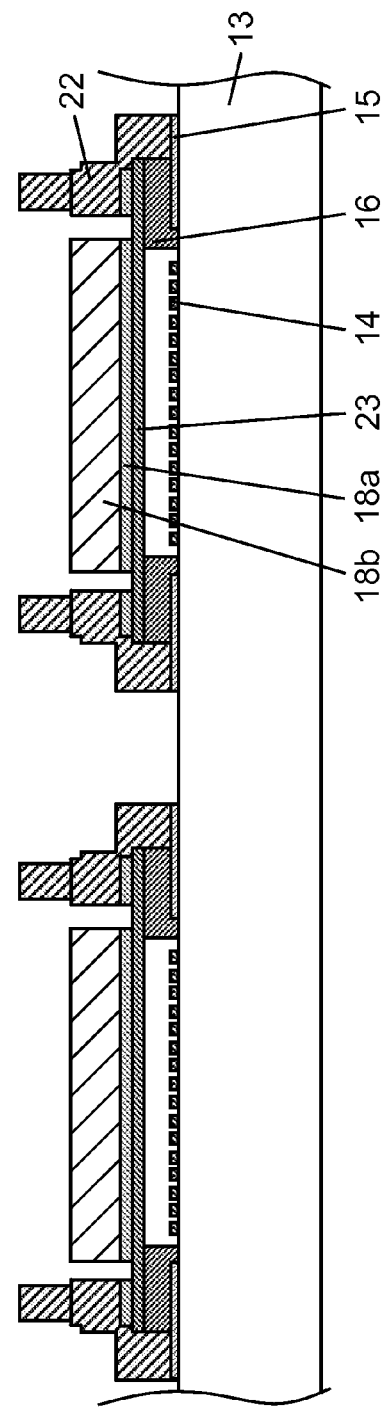
FIG. 5A
FIG. 5B

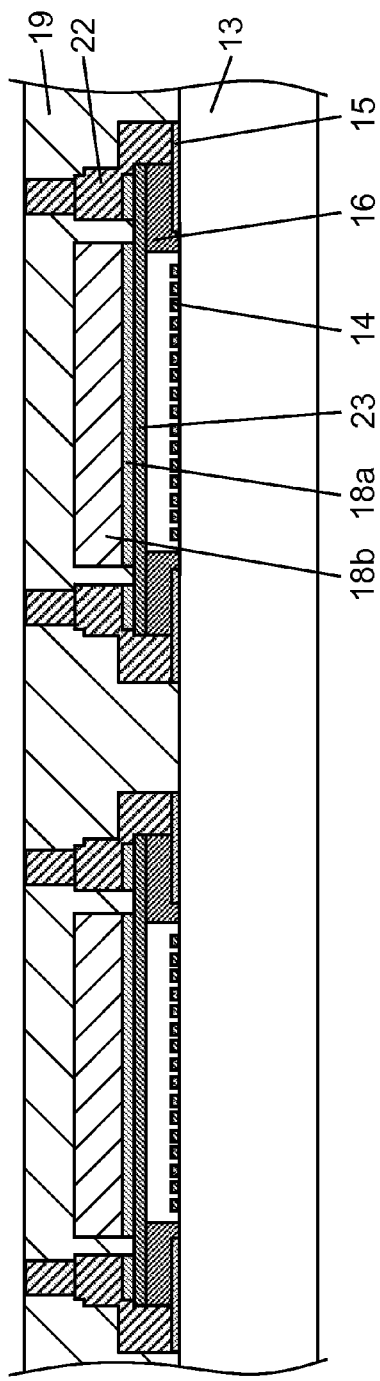
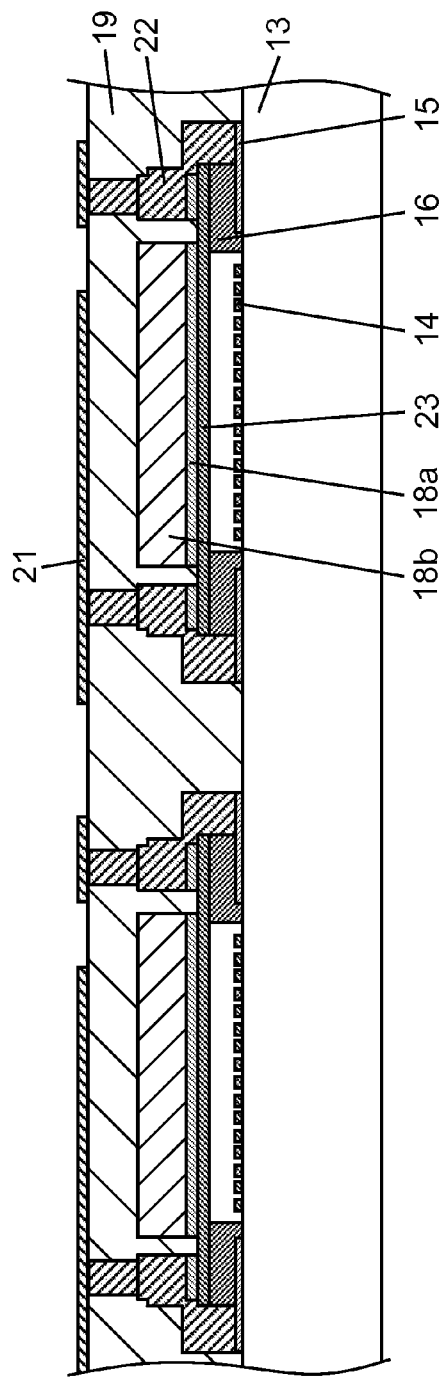
FIG. 6A
FIG. 6B

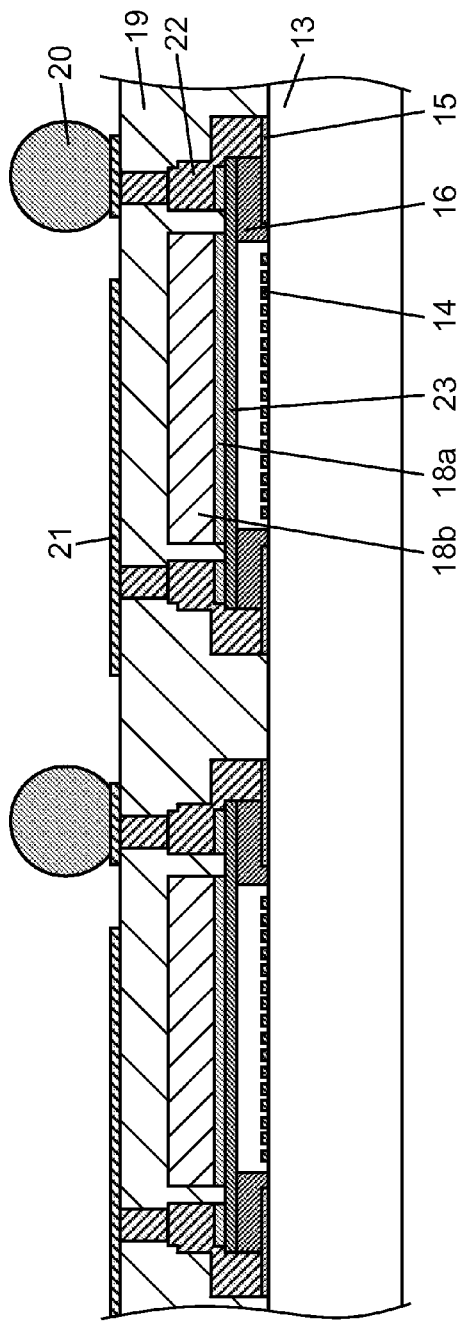
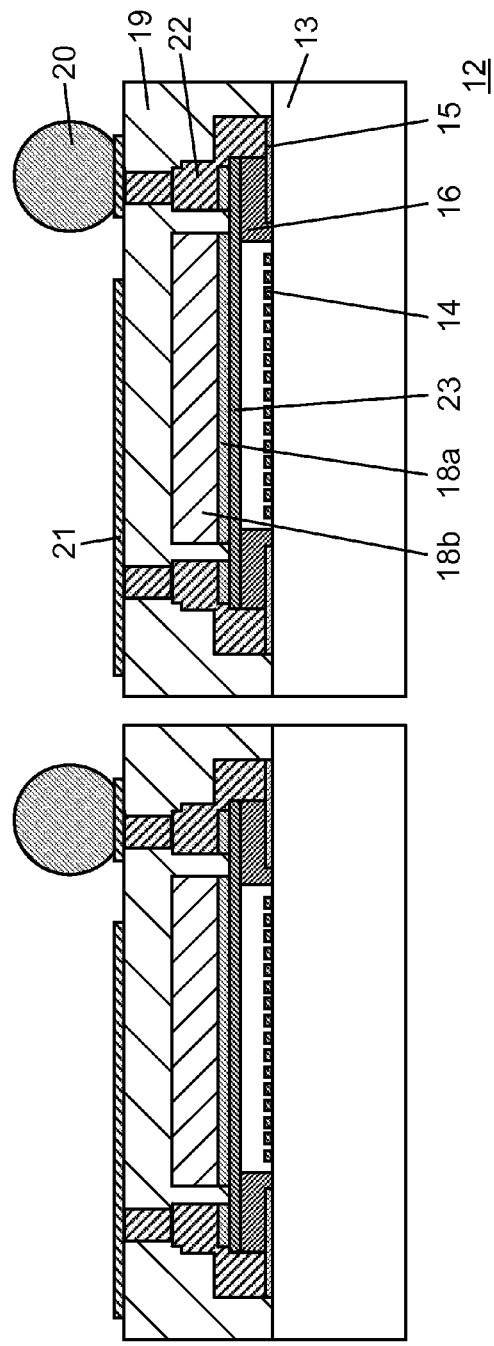
FIG. 7A
FIG. 7B

ELASTIC WAVE DEVICE

BACKGROUND OF THE INVENTION

1. Field of the Invention

The present invention relates to an elastic wave device which is used in a cellular phone, a wireless LAN terminal, and the like.

2. Description of the Related Art

In recent years, a trend has been increasing to transform an elastic wave device into a module and to mount the module in a variety of products such as a cellular phone and a wireless LAN terminal. The modules mounted in the variety of products are desired to be miniaturized and of a low profile as well as to have high reliabilities. On the other hand, the elastic wave device, which utilizes a wave propagating on its surface, needs to have an appropriate space structure because it is a key to realization of miniaturization and high reliabilities.

FIG. 13 is a schematic cross-sectional view showing a configuration of a conventional elastic wave device. As shown in FIG. 13, elastic wave device 101 includes piezoelectric substrate 102, IDT electrode 103, internal electrode 104, support pillar 105, top panel 107, conductor pattern 108, insulation protector 109, external electrode 110, and connection electrode 111.

IDT electrode 103 is disposed on piezoelectric substrate 102. Internal electrode 104 is disposed on piezoelectric substrate 102 and connected to IDT electrode 103. Support pillar 105 is disposed on piezoelectric substrate 102 and provided around IDT electrode 103.

Top panel 107 is formed on the support pillar 105 in such a manner as to cover space 106 above IDT electrode 103. Conductor pattern 108 is formed above top panel 107. Insulation protector 109 covers support pillar 105 and top panel 107. External electrode 110 is disposed above insulation protector 109. Connection electrode 111 is formed through insulation protector 109, to electrically connect external electrode 110 and internal electrode 104 to each other.

In this configuration, in elastic wave device 101 in the related art, conductor pattern 108 has been formed in order to obtain inductance on top panel 107 in an attempt to improve attenuation characteristics.

As information of prior art document related to the invention of this application, for example, International Publication No. 2006/134928 is known.

As described above, in elastic wave device 101 in the related art, conductor pattern 108 has been formed to give inductance on top panel 107. This structure would cause IDT electrode 103 and conductor pattern 108 formed to obtain inductance to interfere with each other, so that properties of the elastic wave device 101 might possibly be deteriorated.

SUMMARY OF THE INVENTION

The present invention has been devised in view of the foregoing problem associated with the related art and an object thereof is to provide an elastic wave device that inhibits interference between an IDT electrode and a conductor pattern formed to obtain inductance.

The present invention provides an elastic wave device including a piezoelectric substrate, an IDT electrode disposed on the piezoelectric substrate, an internal electrode disposed on the piezoelectric substrate and connected to the IDT electrode, a support pillar disposed on the piezoelectric substrate and provided around the IDT electrode, a top panel provided on the support pillar in such a manner as to cover a space above the IDT electrode, an insulation protector provided in such a manner as to cover the support pillar and the top panel, an external electrode disposed on the insulation protector, a conductor pattern disposed on the insulation protector in order to obtain inductance, and a connection electrode provided through the insulation protector, to connect the external electrode and the internal electrode to each other.

BRIEF DESCRIPTION OF DRAWINGS

FIG. 4A shows a process to manufacture the elastic wave device according to the embodiment of the present invention;

FIG. 4B shows a process to manufacture the elastic wave device according to the embodiment of the present invention;

FIG. 5A shows a process to manufacture the elastic wave device according to the embodiment of the present invention;

FIG. 5B shows a process to manufacture the elastic wave device according to the embodiment of the present invention;

FIG. 6A shows a process to manufacture the elastic wave device according to the embodiment of the present invention;

FIG. 6B shows a process to manufacture the elastic wave device according to the embodiment of the present invention;

FIG. 7A shows a process to manufacture the elastic wave device according to the embodiment of the present invention;

FIG. 7B shows a process to manufacture the elastic wave device according to the embodiment of the present invention;

DETAILED DESCRIPTION OF THE PREFERRED EMBODIMENT

Hereinafter, an embodiment of the present invention will be described with reference to the drawings.

Exemplary Embodiment

Figure 1:
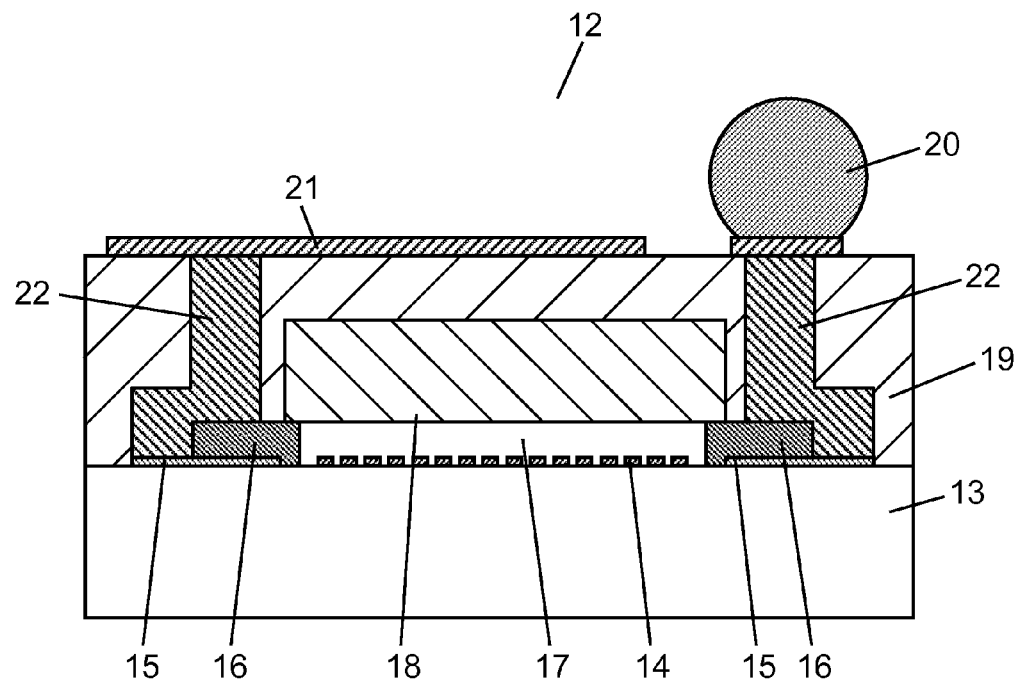
FIG. 1 shows a schematic cross-sectional view of a configuration of an elastic wave device according to an embodiment of the present invention.

FIG. 1 is a schematic cross-sectional view showing a configuration of elastic wave device 12 according to an embodiment of the present invention.

In FIG. 1, elastic wave device 12 includes piezoelectric substrate 13 and interdigital transducer (IDT) electrode 14 disposed on an upper surface (main surface) of piezoelectric substrate 13. Elastic wave device 12 is of a chip size package in which insulation protector 19 is formed on piezoelectric substrate 13 in such a manner as to cover IDT electrode 14 so that IDT electrode 14 may be protected from external accesses.

Elastic wave device 12 further includes internal electrode 15, support pillar 16, and top panel 18. Internal electrode 15 is provided on piezoelectric substrate 13 and electrically connected to IDT electrode 14. Support pillar 16 lies on internal electrode 15 and surrounds IDT electrode 14. Top panel 18 is provided on support pillar 16 in such a manner as to cover space 17 above IDT electrode 14.

Elastic wave device 12 further includes external electrode 20, connection electrode 22, and conductor pattern 21. External electrode 20 is provided above insulation protector 19. Connection electrode 22 electrically connects external electrode 20 and internal electrode 15 to each other. Conductor pattern 21 is formed on insulation protector 19 to obtain an inductance component.

Next, a description will be given in detail of the components of elastic wave device 12.

Piezoelectric substrate 13 is formed of a single crystal piezoelectric substance having a sheet thickness of about 100 µm to 450 µm. Piezoelectric substrate 13 is made of, for example, crystal or a lithium tantalate-based, lithium niobate-based, or potassium niobate-based substance.

IDT electrode is a comb-like electrode having a film thickness of about 0.1 µm to 0.5 µm. IDT electrode 14 is made of at least discrete one of metals such as aluminum, copper, silver, gold, titanium, tungsten, platinum, chromium, and molybdenum, an alloy containing any one of them as its main component, or a laminate of those metals.

Internal electrode 15 is a conductor configured to electrically connect IDT electrode 14 and external electrode 20 to each other. Internal electrode 15 is made of discrete one of metals such as aluminum, copper, silver, and titanium, an alloy containing any one of them as its main component, or a laminate of those metals.

Support pillar 16 has a height of 5 µm to 25 µm and surrounds at least part of the periphery of IDT electrode 14. The material of support pillar 16 may be the same as that of, for example, insulation protector 19 and preferably be a resin because it can be easily formed into a predetermined shape. If a photosensitive resin is used as the material of support pillar 16, a plurality of support pillars 16 can be formed into a desired shape accurately in order to form a plurality of elastic wave devices 12 on piezoelectric substrate 13. The photosensitive resin may include a variety of resins having photosensitivity such as a photosensitive polyimide resin, a photosensitive epoxy resin, and a photosensitive acrylate resin. The photosensitive polyimide resin is preferable in particular as the material of support pillar 16 because it has a high glass transition point and good reliabilities in a high temperature environment.

Figure 2:
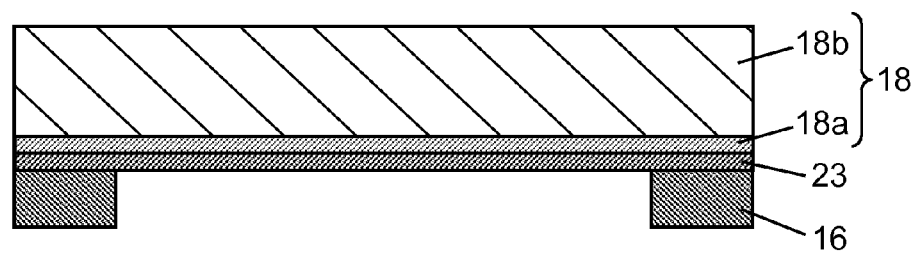
FIG. 2 shows a schematic cross-sectional view of a configuration in the vicinity of a top panel of the elastic wave device according to the embodiment of the present invention.

FIG. 2 is a schematic cross-sectional view showing a configuration in the vicinity of top panel 18 of elastic wave device 12 according to the embodiment of the present invention.

As shown in FIG. 2, in this configuration, top panel 18 includes lid 18a provided on adhesion layer 23 formed on support pillar 16. On lid 18a, lid reinforcement layer 18b is formed preferably. This configuration can improve endurance of elastic wave device 12 during molding.

Adhesion layer 23 is formed of an adhesive agent having a thickness of about 1 µm to 20 µm. Adhesion layer 23 is made of, for example, an epoxy-based, polyphenylene-based, or butadiene-based resin or a mixed resin of them. The material of adhesion layer 23 has higher adhesive force to insulation protector 19 per unit area than support pillar 16.

Lid 18a is stuck and held to the upper part of support pillar 16 via adhesion layer 23. Lid 18a is formed like a plate having a thickness of about 1 µm to 30 µm.

In elastic wave device 12, IDT electrode 14 is stored in space 17 formed by lid 18a, piezoelectric substrate 13, and support pillar 16. If lid 18a is made of a metal, top panel 18 can be excellent in mechanical strength. Further, if lid 18a is made of a material having conductivity, a potential of lid 18a can be controlled. Additionally, if lid 18a is made of copper, it can have substantially the same linear coefficient of expansion with single crystal piezoelectric substrate 13, so that it is possible to inhibit elastic wave device 12 from warping during manufacturing. Lid 18a can also be formed like foil. In this case, adhesion layer 23 is formed on the upper surface of support pillar 16 beforehand and then lid 18a is stuck to the upper part of support pillar 16 so that the structure can be thin and strong for easy handling in manufacturing.

Lid reinforcement layer 18b is formed on the upper surface of lid 18a up to a thickness of about 20 µm to 40 µm by electrolytic plating. Preferably lid reinforcement layer 18b is made of copper because it can be excellent in mechanical strength and match piezoelectric substrate 13 in terms of linear coefficient of expansion.

A region enclosed by piezoelectric substrate 13, support pillar 16, and top panel 18 is written as space 17. Space 17 is airtight and stores IDT electrode 14. Space 17 may be filled with a normal pressure air; however, if it is depressured and airproofed, IDT electrode 14 can be inhibited from being corroded.

Insulation protector 19 is formed on piezoelectric substrate 13, to cover lateral and top surfaces of support pillar 16 and a top surface of top panel 18. Further, insulation protector 19 has a function to protect IDT electrode 14 from mechanical impact and moisture by covering an entirety of the main surface of piezoelectric substrate 13. Preferably insulation protector 19 is made of a thermosetting resin because it is excellent in handling. Further, it is made of an epoxy resin especially preferably in terms of heat resistance and airtightness. Moreover, by containing filler in the epoxy resin, its linear coefficient of expansion can be reduced. The filler to be used may be alumina powder, silicon dioxide power, magnesium oxide powder, etc. It is to be noted that besides those, the filler may be any other one of various materials.

Preferably connection electrode 22 is made of copper because it can be excellent in mechanical strength and match piezoelectric substrate 13 in terms of linear coefficient of expansion.

The following will describe a method for manufacturing elastic wave device 12 according to the embodiment of the present invention having such a configuration as described above.

FIGS. 3A, 3B, 4A, 4B, 5A, 5B, 6A, 6B, 7A, and 7B show processes to manufacture the elastic wave device 12 according to the embodiment of the present invention.

Figure 3A:
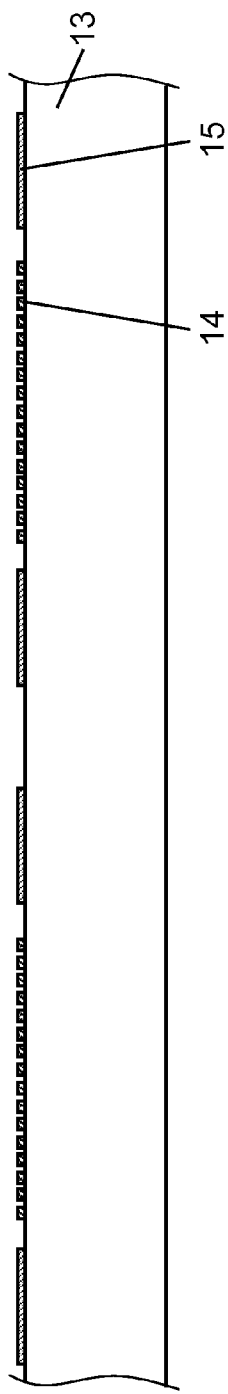
FIG. 3A shows a process to manufacture the elastic wave device according to the embodiment of the present invention.

First, as shown in FIG. 3A, photolithographic technologies by use of resists are employed to form a plurality of IDT electrodes 14 by sputtering and internal electrode 15 by evaporation on the surface (main surface) of piezoelectric substrate 13.

Next, a film formation method such as spin coating, dispensing, or screen printing is employed to form a photosensitive polyimide-based resin on all over the main surface of piezoelectric substrate 13 in such a manner as to cover IDT electrodes 14 and internal electrode 15. Spin coating is used preferably, because a uniform film thickness can be obtained.

Figure 3B:
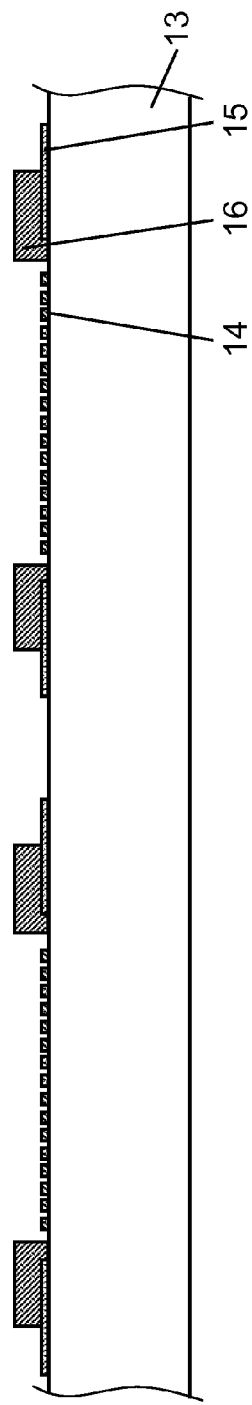
FIG. 3B shows a process to manufacture the elastic wave device according to the embodiment of the present invention.

Then, a film made of this photosensitive polyimide-based resin is exposed to light from the above to be developed and, further, hardened thermally. With this, as shown in FIG. 3B, support pillar 16 that surrounds IDT electrodes 14 can be formed. It is to be noted that the hardening of the material is promoted by heating, as required, support pillar 16 after being processed into a predetermined shape.

Next, as shown in FIG. 4A, metal foil (preferably, copper foil) that makes cover 18a is stuck to the upper surface of support pillar 16 via adhesion layer 23. By conducting photolithographic processing by use of a resist onto lid 18a, the metal foil is etched into a predetermined pattern shape and then the resist is removed. As a result, gap 24 is formed in lid 18a as shown in FIG. 4B.

Afterward, unnecessary portions of both of adhesion layer 23 and lid 18a are peeled mechanically. With this, as shown in FIG. 5A, a configuration can be obtained in which space 17 above IDT electrodes 14 is covered by lid 18a and adhesion layer 23. It is to be noted that it is preferable not to leave lid 18a and adhesion layer 23 whole area on the upper surface of support pillar 16. That is, as viewed from the above, preferably lid 18a and adhesion layer 23 are formed more inside than outer edges of the upper surface of support pillar 16. This is because if lid 18a and adhesion layer 23 project more outside than the upper surface of support pillar 16 as viewed from the above, when forming an underlying layer by sputtering subsequently, a problem may occur in that the underlying layer does not easily stick to lateral surfaces of support pillar 16.

Next, an underlying layer (not shown) is formed by sputtering it on all the main surface of piezoelectric substrate 13. Of the underlying layer, a portion formed on the lateral surface of support pillar 16 and that formed on the upper surface of internal electrode 15 make an electrode underlying layer. Further, such a portion of the underlying layer as to be formed on the upper surface of lid 18a makes a lid underlying layer.

Next, the photolithographic technologies are used to form a resist (not shown) except for a portion where electrolytic plating growth is expected. Specifically, the resist is formed in such a manner as to expose an upper part of the electrode underlying layer and an upper part of the lid underlying layer and cover the other portions.

Then, by conducting first electrolytic plating processing, part of connection electrode 22 can be formed on the electrode underlying layer simultaneously with the formation of lid reinforcement layer 18b. By forming lid reinforcement layer 18b in such a manner, lid 18a can be reinforced. Moreover, by forming connection electrode 22 simultaneously with lid reinforcement layer 18b, it is possible to form lid reinforcement layer 18b and connection electrode 22 efficiently.

Further, the resist is formed on all the main surface of piezoelectric substrate 13 except for the electrolytic plating growth-expected portion on the upper part of connection electrode 22. Afterward, second electrolytic plating processing is conducted to grow connection electrode 22 further and then the resist is removed. It is to be noted that if lid reinforcement layer 18b need not be formed because, for example, lid 18a is strong enough, it is possible to form connection electrode 22 only by conducting the first electrolytic plating processing step.

Further, as shown in FIG. 5B, lid reinforcement layer 18b and connection electrode 22 electrically conducting to each other via the underlying layer are electrically isolated from each other by removing the underlying layer.

Next, as shown in FIG. 6A, insulation protector 19 is formed in such a manner as to cover the main surface of piezoelectric substrate 13 and structures on the main surface except for the exposed upper surface of connection electrode 22. Insulation protector 19 can be formed by printing.

It is to be noted that to form insulation protector 19 at exactly the same height as connection electrode 22, a method can be used to form insulation protector 19 higher than the upper surface of connection electrode 22 once and then mechanically grind insulation protector 19 down. In this case, after forming insulation protector 19 in such a manner as to cover the main surface of piezoelectric substrate 13 and all the structures on this main surface including connection electrode 22, insulation protector 19 may be ground down mechanically.

Next, as shown in FIGS. 6B and 7A, external electrode 20 and conductor pattern 21 which is formed to obtain inductance are formed to be electrically connected to the upper surface of connection electrode 22.

It is to be noted that protection layer may be formed on conductor pattern 21 which is formed to obtain inductance. This can prevent the inductance from being deteriorated.

Finally, as shown in FIG. 7B, solder printing is performed and piezoelectric substrate 13 and insulation protector 19 are cut off simultaneously by dicing, so that discrete elastic wave devices 12 can be obtained from an aggregate substrate.

By manufacturing the elastic wave device 12 according to this described method, insulation protector 19 can be interposed between IDT electrode 14 and conductor pattern 21 which is formed to obtain inductance. This configuration enables obtaining elastic wave device 12 that inhibits interference between IDT electrode 14 and conductor pattern 21 formed to obtain inductance.

As described above, elastic wave device 12 presented in the present embodiment is of a surface acoustic wave (SAW) package configuration in which insulation protector 19 is formed in such a manner as to give space 17 above piezoelectric substrate 13. This configuration generally has low impact resistance because piezoelectric substrate 13 is not fixed to a ceramic substrate, as compared to the conventional SAW package configuration in which the piezoelectric substrate is disposed on the ceramic substrate. However, in elastic wave device 12 according to the present embodiment, conductor pattern 21 is provided on insulation protector 19, giving an effect to improve the impact resistance of elastic wave device 12.

Figure 8:
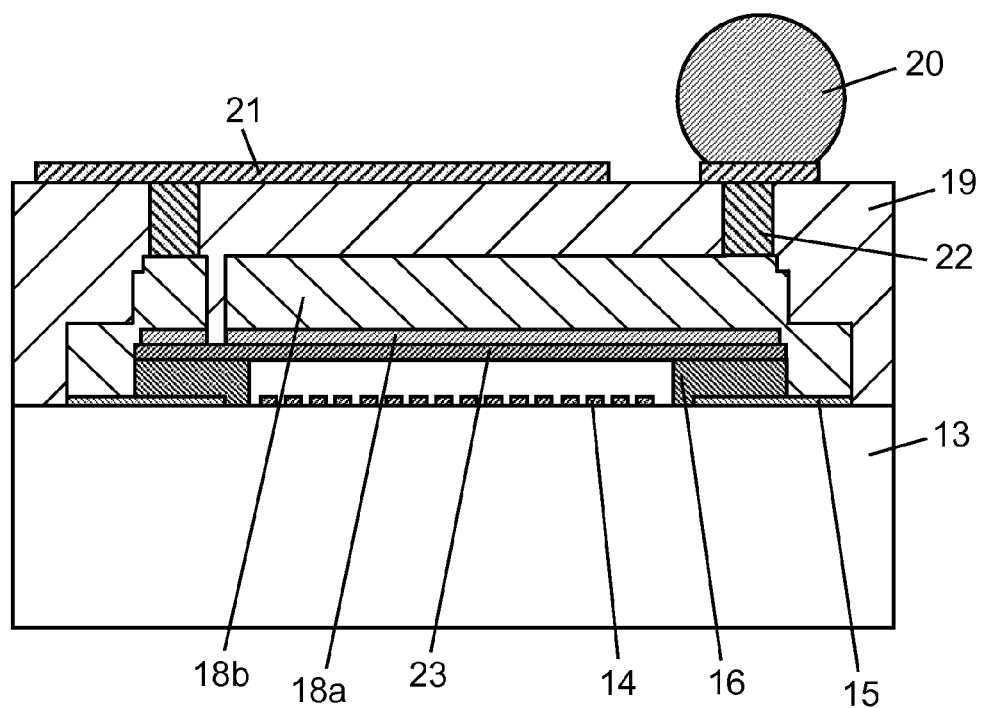
FIG. 8 shows a schematic cross-sectional view of another configuration of the elastic wave device according to the embodiment of the present invention.

FIG. 8 is a schematic cross-sectional view showing another configuration of the elastic wave device according to the embodiment of the present invention. In elastic wave device 32 shown in FIG. 8, top panel 18 is set to a ground potential by connecting lid 18a or lid reinforcement layer 18b of top panel 18 and connection electrode 22 having the ground potential to each other. In this configuration, top panel 18 plays a role of a noise shielding layer for IDT electrode 14.

Figure 9A:
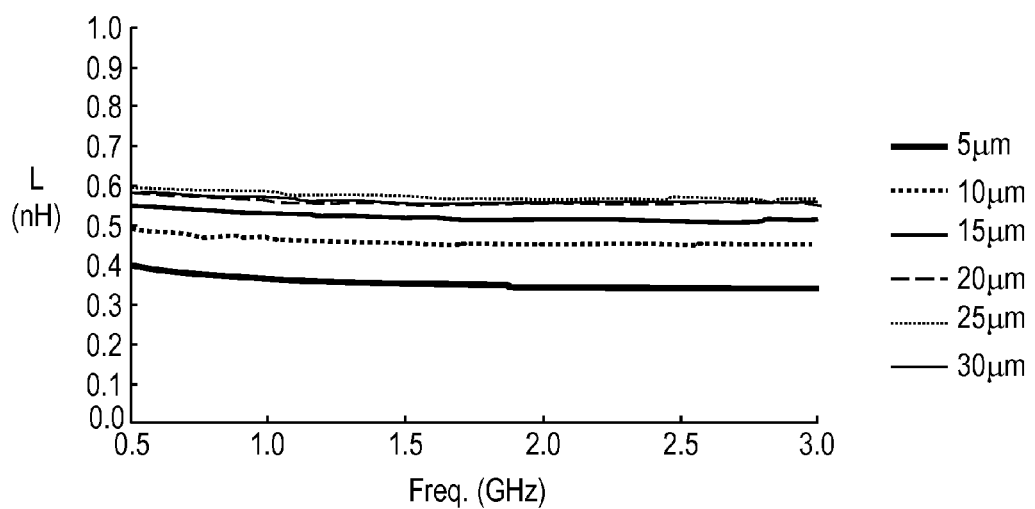
FIG. 9A shows a change in inductance component as a function of a distance between the top panel and a conductor pattern in the elastic wave device according to the embodiment of the present invention.
Figure 9B:
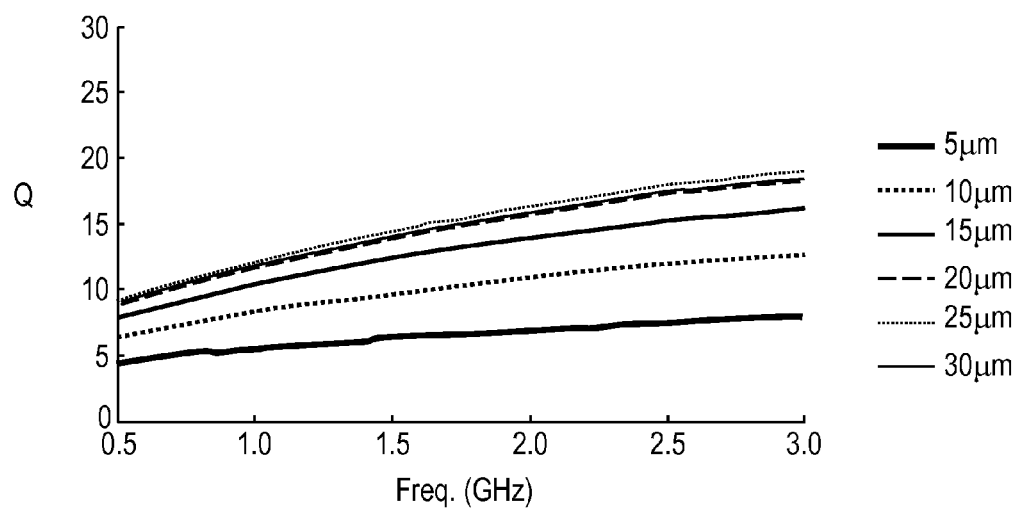
FIG. 9B shows a change in inductance component as a function of a distance between the top panel and the conductor pattern in the elastic wave device according to the embodiment of the present invention.

FIGS. 9A and 9B are graphs showing changes in inductance component as a function of a distance between top panel 18 and conductor pattern 21 in elastic wave device 32 according to the embodiment of the present invention.

In FIG. 9A, its horizontal axis represents a frequency (GHz) and its vertical axis represents an inductance (L) (nH) value. In FIG. 9B, the horizontal axis represents a frequency (GHz) and the vertical axis represents a Q-value.

FIG. 9A shows relationships between the L-value and the frequency in cases where the distance between top panel 18 and conductor pattern 21 is 5 μm, 10 μm, 15 μm, 20 μm, 25 μm, and 30 μm respectively. For example, the L-value for a frequency of 1 GHz is 0.37 nH if the distance is 5 μm, 0.47 nH if the distance is 10 μm, 0.53 nH if the distance is 15 μm, 0.56 nH if the distance is 20 μm, 0.57 nH if the distance is 25 μm, and 0.57 nH if the distance is 30 μm. With this, it is found that deteriorations in L-value would be remarkable if the distance between top panel 18 and conductor pattern 21 is 10 μm or less.

FIG. 9B shows relationships between the Q-value and the frequency in cases where the distance between top panel 18 and conductor pattern 21 is 5 μm, 10 μm, 15 μm, 20 μm, 25 μm, and 30 μm respectively. For example, the Q-value for a frequency of 1 GHz is 5.5 if the distance is 5 μm, 7.8 if the distance is 10 μm, 10.2 if the distance is 15 μm, 11.2 if the distance is 20 μm, 11.6 if the distance is 25 μm, and 11.3 if the distance is 30 μm. With this, it is found that deteriorations in Q-value would be remarkable if the distance between top panel 18 and conductor pattern 21 is 10 μm or less.

From those, it is found that a degree of deteriorations in each of L-value and Q-value of the inductance components can be inhibited by setting the distance between top panel 18 and conductor pattern 21 to a value larger than 10 μm, preferably at least 15 μm. This is because coupling effects can be inhibited between the inductance component of conductor pattern 21 and top panel 18 made of metal. However, when the value of the distance between top panel 18 and conductor pattern 21 becomes larger than 25 μm, further improvement becomes difficult.

It is to be noted that although examples in FIGS. 9A and 9B have set a thickness of top panel 18 to 30 μm (3.5 μm for lid 18a and 26.5 μm for lid reinforcement layer 18b) and a thickness of adhesion layer 23 to about 5 μm, the degree of deteriorations in each of L-value and Q-value can be inhibited by setting the distance between top panel 18 and conductor pattern 21 to a value larger than 10 μm, preferably at least 15 μm, even if the thicknesses of top panel 18 and adhesion layer 23 are changed.

The following will describe still another configuration of the elastic wave device according to the present embodiment. FIGS. 10A, 10B, 11A, 11B, and 12 are explanatory schematic diagrams of yet another configurations of the elastic wave device according to the present embodiment.

Figure 10A:
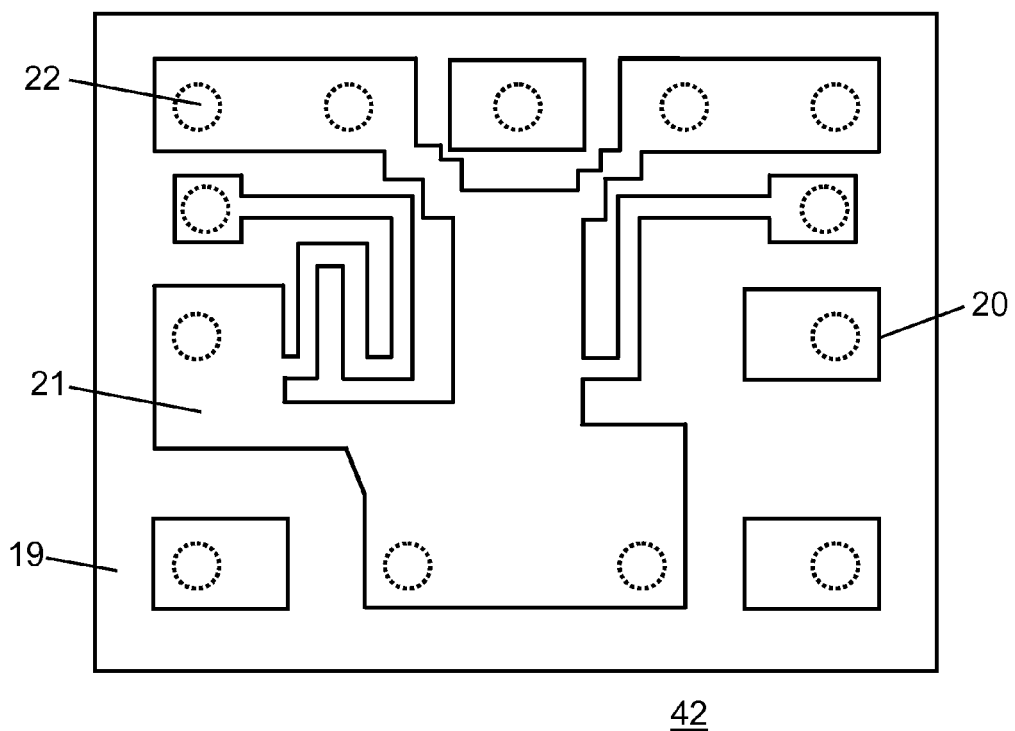
FIG. 10A shows an explanatory schematic plain view of still another configuration of the elastic wave device according to the embodiment of the present invention.
Figure 10B:
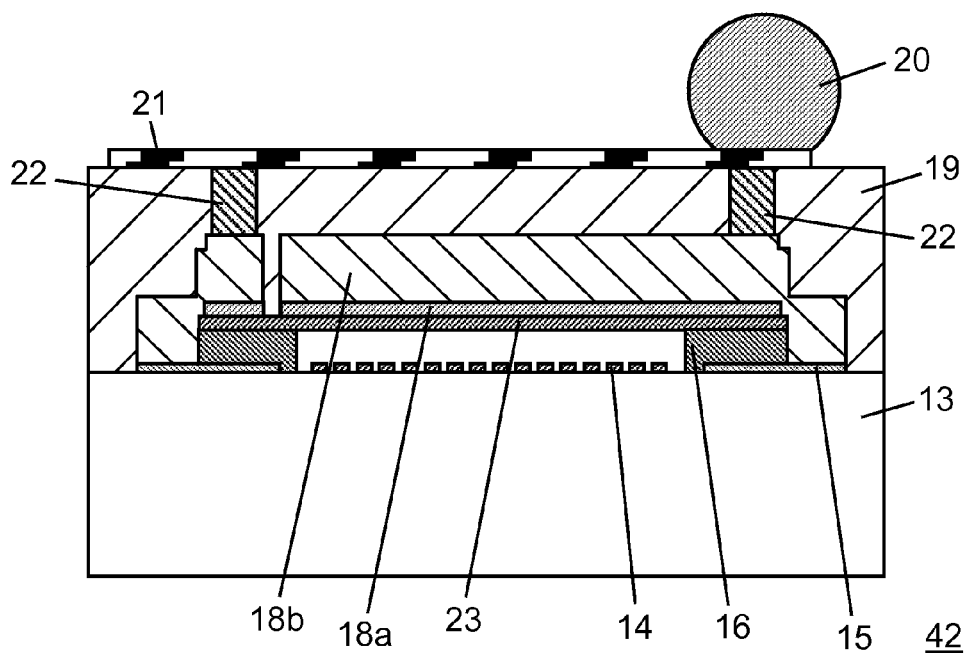
FIG. 10B shows an explanatory schematic cross-sectional view of yet another configuration of the elastic wave device according to the embodiment of the present invention.

FIG. 10A is a schematic plan view of elastic wave device 42 and FIG. 10B is a schematic cross-sectional view of elastic wave device 42. As shown in FIGS. 10A and 10B, conductor pattern 21 is connected to a plurality of connection electrodes 22 having the ground potential. Such a configuration enables sharing a ground terminal in a package and inhibiting changes in properties of elastic wave device 42 after being mounted on a circuit board.

Figure 11A:
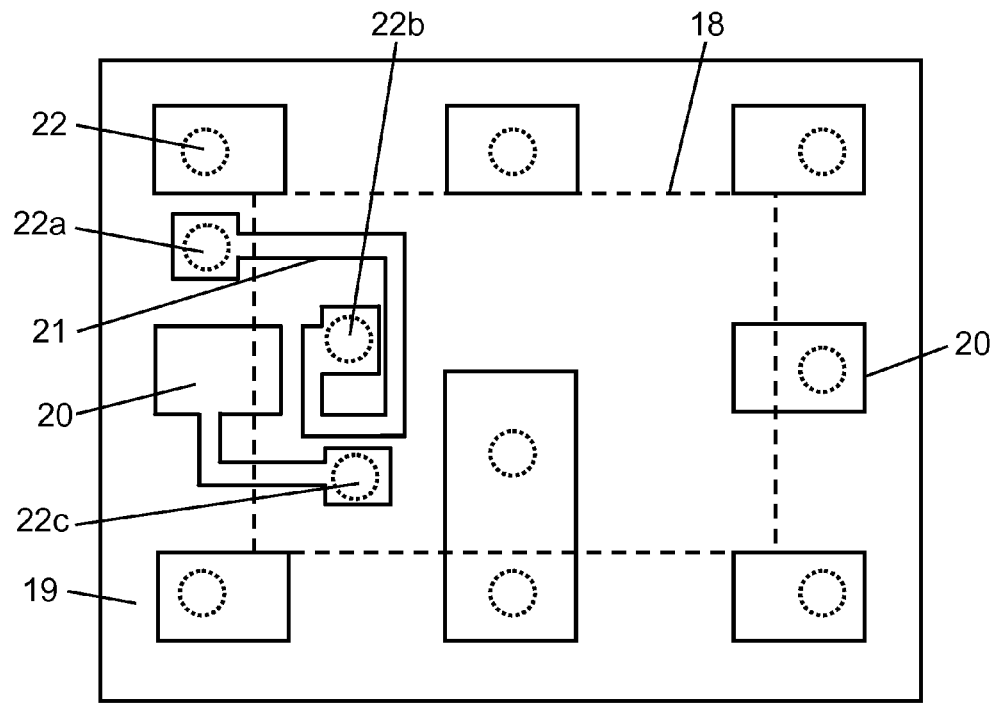
FIG. 11A shows an explanatory schematic plain view of yet another configuration of the elastic wave device according to the embodiment of the present invention.
Figure 11B:
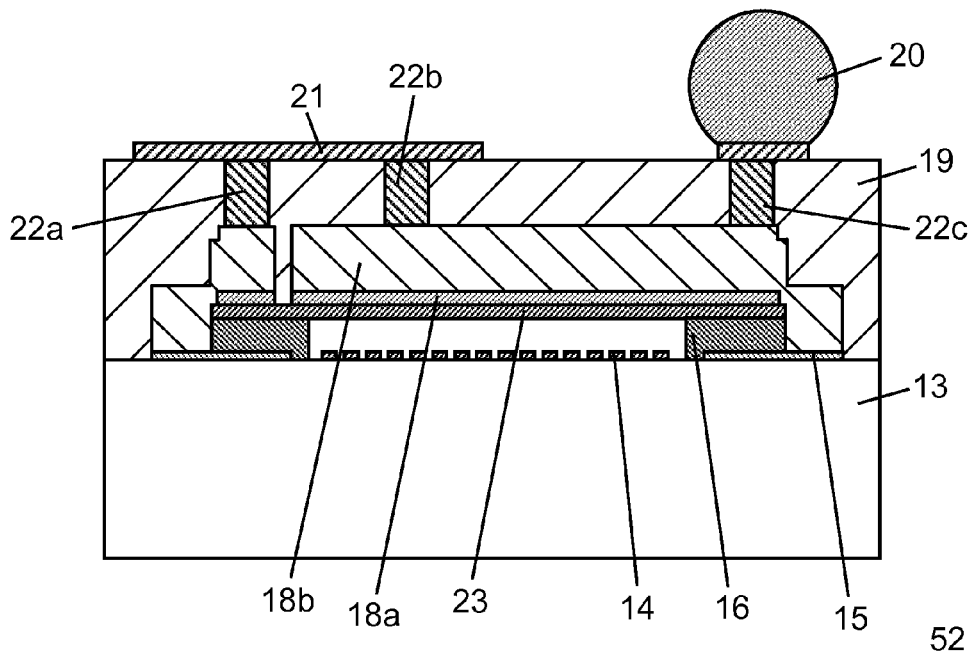
FIG. 11B shows an explanatory schematic cross-sectional view of yet another configuration of the elastic wave device according to the embodiment of the present invention.

FIG. 11A is a schematic plan view of elastic wave device 52 and FIG. 11B is a schematic cross-sectional view of elastic wave device 52. As shown in FIGS. 11A and 11B, elastic wave device 52 has first ground electrode 22a, second ground electrode 22b, and third ground electrode 22c. In this configuration, first ground electrode 22a is connected to conductor pattern 21 and internal electrode 15 providing the ground potential. Second ground electrode 22b is connected to top panel 18 and conductor pattern 21 formed to obtain inductance, while third ground electrode 22c is connected to top panel 18 and external electrode 20. Such a configuration also enables sharing the ground terminals in the package and inhibiting changes in properties of elastic wave device 52 after being mounted on the circuit board.

Figure 12:
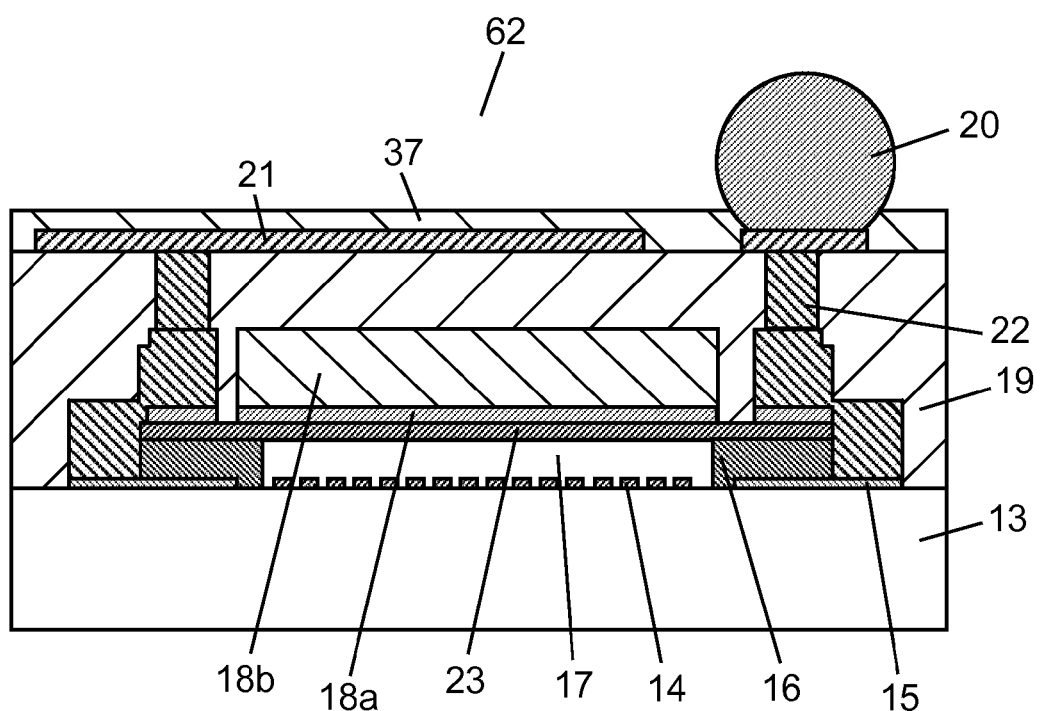
FIG. 12 shows an explanatory schematic cross-sectional view of yet another configuration of the elastic wave device according to the embodiment of the present invention.
Figure 13:
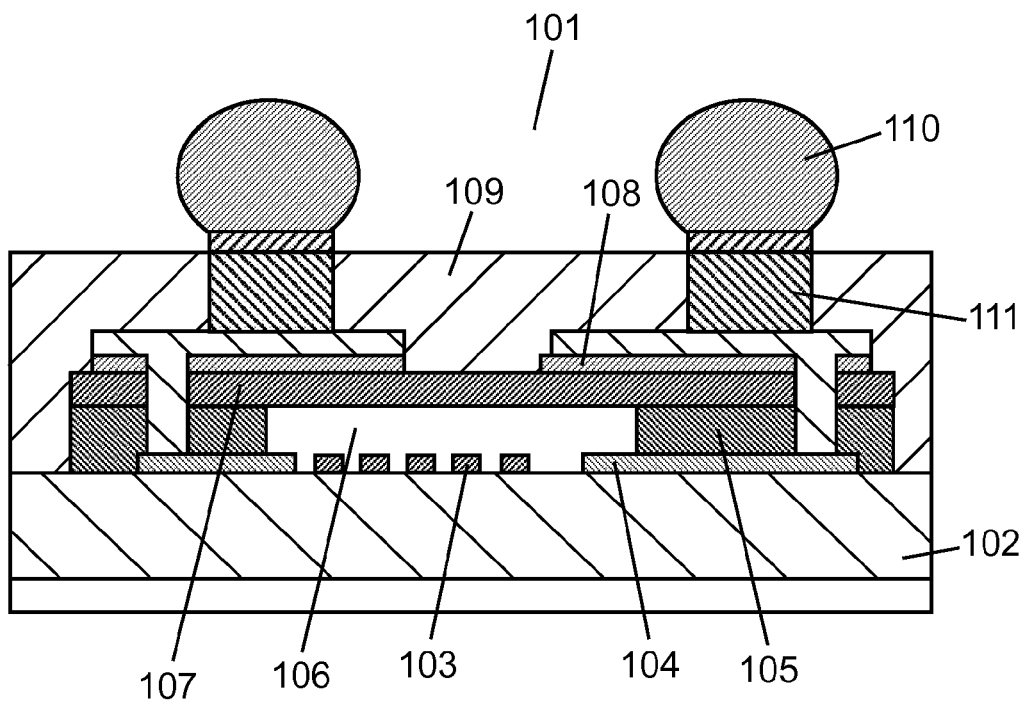
FIG. 13 shows a schematic cross-sectional view of a configuration of a conventional elastic wave device.

FIG. 12 is a schematic cross-sectional view showing a configuration of elastic wave device 62. As shown in FIG. 12, in elastic wave device 62, protector 37 is formed in such a manner as to cover conductor pattern 21, so that deteriorations in inductance can be prevented.

As described above, the elastic wave device of the present invention is usefully applied in a cellular phone, a wireless LAN terminal, etc. because it can inhibit interference between the IDT electrode and the conductor pattern formed to obtain inductance so that the Q-value as an elastic wave resonator may be improved.

What is claimed is:
1. An elastic wave device comprising:
a piezoelectric substrate;
an interdigital transducer (IDT) electrode disposed on the piezoelectric substrate:
an internal electrode disposed above the piezoelectric substrate and connected to the IDT electrode;
a support pillar disposed above the piezoelectric substrate and provided around the IDT electrode;
a top panel provided above the support pillar to cover a space above the IDT electrode;
an insulation protector provided to cover the support pillar and the top panel;
an external electrode disposed above the insulation protector;
a conductor pattern disposed above the insulation protector for obtaining inductance;
and
a connection electrode provided through the insulation protector for connecting the external electrode to the internal electrode, wherein
at least part of the top panel is made of metal and connected to the connection electrode so that the top panel has a ground potential.
2. The elastic wave device according to claim 1, further comprising
a protector that covers the conductor pattern.
3. The elastic wave device according to claim 1, wherein the conductor pattern and the top panel are separated from each other by at least 15 μm.
4. The elastic wave device according to claim 1, wherein the conductor pattern is connected to a plurality of connection electrodes having the ground potential.
5. An elastic wave device comprising:
a piezoelectric substrate;
an interdigital transducer (IDT) electrode disposed on the piezoelectric substrate:
an internal electrode disposed above the piezoelectric substrate and connected to the IDT electrode;
a support pillar disposed above the piezoelectric substrate and provided around the IDT electrode;
a top panel provided above the support pillar to cover a space above the IDT electrode;
an insulation protector provided to cover the support pillar and the top panel;
an external electrode disposed above the insulation protector for obtaining inductance; and
a connection electrode provided through the insulation protector for connecting the external electrode to the internal electrode, wherein
the conductor pattern is connected to a plurality of connection electrodes having a ground potential,
the plurality of connection electrodes includes a first ground electrode, a second ground electrode, and a third ground electrode, the first ground electrode is connected to the internal electrode and the conductor pattern,
the second ground electrode is connected to the conductor pattern and the top panel, and
the third ground electrode is connected to the top panel and the external electrode.

6. The elastic wave device according to claim 5, further comprising a protector that covers the conductor pattern.

7. The elastic wave device according to claim 5, wherein the conductor pattern and the top panel are separated from each other by at least 15 μm.

* * * * *